(12) United States Patent
Shin et al.

(10) Patent No.: US 9,116,436 B2
(45) Date of Patent: Aug. 25, 2015

(54) MASKLESS EXPOSURE APPARATUS INCLUDING SPATIAL FILTER HAVING PHASE SHIFTER PATTERN AND EXPOSURE METHOD

(75) Inventors: Younghoon Shin, Hwaseong-Si (KR); Kunsoo Kim, Suwon-Si (KR); Namyeol Yang, Osan-Si (KR)

(73) Assignee: LG Electronics Inc., Seoul (KR)

( * ) Notice: Subject to any disclaimer, the term of this patent is extended or adjusted under 35 U.S.C. 154(b) by 530 days.

(21) Appl. No.: 13/698,167

(22) PCT Filed: Oct. 14, 2011

(86) PCT No.: PCT/KR2011/007658
§ 371 (c)(1),
(2), (4) Date: Nov. 15, 2012

(87) PCT Pub. No.: WO2012/050388
PCT Pub. Date: Apr. 19, 2012

(65) Prior Publication Data
US 2013/0057843 A1 Mar. 7, 2013

(30) Foreign Application Priority Data
Oct. 14, 2010 (KR) .................. 10-2010-0100454

(51) Int. Cl.
*G03F 1/26* (2012.01)
*G03F 7/20* (2006.01)
(52) U.S. Cl.
CPC .............. *G03F 1/26* (2013.01); *G03F 7/70275* (2013.01); *G03F 7/70291* (2013.01); *G03F 7/70308* (2013.01)
(58) Field of Classification Search
CPC ... G03F 1/26; G03F 7/70291; G03F 7/70308; G03F 7/70275
See application file for complete search history.

(56) References Cited

U.S. PATENT DOCUMENTS

| | | | |
|---|---|---|---|
| 6,333,780 B1* | 12/2001 | Tsukuda | 355/68 |
| 2005/0206866 A1* | 9/2005 | Ozaki et al. | 355/53 |
| 2006/0066844 A1* | 3/2006 | Moribe et al. | 356/237.5 |
| 2007/0268545 A1* | 11/2007 | Gluckstad | 359/237 |
| 2009/0132063 A1* | 5/2009 | Suzuki et al. | 700/12 |
| 2012/0228475 A1* | 9/2012 | Pang et al. | 250/208.1 |
| 2014/0071421 A1* | 3/2014 | De Jager et al. | 355/71 |

FOREIGN PATENT DOCUMENTS

| | | |
|---|---|---|
| JP | 2007-79315 A | 3/2007 |
| JP | 2009-86669 A | 4/2009 |
| KR | 10-2009-0091454 A | 8/2009 |

* cited by examiner

Primary Examiner — Deoram Persaud
(74) Attorney, Agent, or Firm — Birch, Stewart, Kolasch & Birch, LLP

(57) ABSTRACT

The present invention relates to a maskless exposure apparatus and a maskless exposure method which increase resolution of an exposure pattern and enhance efficiency of an optical system by using a phase shifter. More specifically, according to one aspect of the present invention, the maskless exposure apparatus includes: a lighting unit for outputting predetermined light; a spatial light modulator (SLM) for receiving the light from the lighting unit and outputting a light having a predetermined pattern; a beam expander for expanding the light outputted from the spatial light modulator; a micro lens array (MLA) for dividing the light expanded from the beam expander into a plurality of lights and collecting the lights; and a projection lens for adjusting the resolution of the lights collected through the micro lens array and project the adjusted lights into a target, a spatial filter having a phase shifter pattern being positioned between the micro lens array and the projection lens.

18 Claims, 10 Drawing Sheets

MASKLESS EXPOSURE APPARATUS INCLUDING SPATIAL FILTER HAVING PHASE SHIFTER PATTERN AND EXPOSURE METHOD

TECHNICAL FIELD

The present invention relates to The present disclosure relates to a maskless exposure apparatus and a maskless exposure method, and particularly, to a maskless exposure apparatus and a maskless exposure method, which can increase resolution of an exposure pattern using a phase shifter pattern and improve efficiency of an optical system

BACKGROUND ART

In general, photolithography is a process of irradiating light onto a semiconductor wafer through a mask having a circuit pattern to be formed so as to transfer the circuit pattern from the mask to a photoresist, i.e., a technique for forming a fine pattern at a desired portion using a light source, and an exposure apparatus is an apparatus for performing the process. The exposure apparatus is frequently used not only in semiconductor industries but also in various display industries.

The exposure apparatus can be divided into proximity exposure, projection exposure, maskless exposure, etc. according to exposure methods. The maskless exposure is a method performed by removing a photomask commonly employed in the exposure methods.

Under the recent market situation of flat panel displays (FPDs), printed circuit boards (PCBs), etc., studies have been conducted to develop large-sized and high-definition FPDs, PCBs, etc. However, improvements are required in many fields so that the maskless exposure apparatus comes into the spotlight under the market situation.

The most difficult problem to be solved is a problem of an optical system included in the maskless exposure apparatus. The optical system is configured to include a light source unit for irradiating light, a unit for adjusting the angle of light, a light condensing unit, a unit for increasing the resolution of light, etc.

In an optical system of a related art maskless exposure apparatus, a large-sized substrate should be carried at a high speed in order to perform exposure while scanning the substrate without any mask, and the exposure should be performed while scanning more pixel data several times in order to implement a higher-definition pattern. However, existing digital exposure apparatuses convert a predetermined light source into spots and irradiate the spots in an array form. Therefore, the existing digital exposure apparatuses have used a method in which individual controls are impossible.

According to the related art maskless exposure apparatus, when a light condensing lens unit is used, there is a limitation in obtaining high resolution due to the non-uniformity of focus and light amount of each lens included in the light condensing lens unit.

In case of a digital exposure apparatus using a spatial light modulator, the alignment between the spatial light modulator and a light condensing lens unit requires a considerably fine level in order to implement high resolution. However, it is very difficult to implement a very precise alignment between units produced through physically different processes. Since a focus is formed on a final photoresist (PR) surface due to light interference caused by a substantial cross-talk, intensity of illumination is not uniform, and resolution is degraded.

Therefore, it is required to develop a method for ensure high resolution of an exposure pattern by easily correcting the alignment between a plurality of optical equipments included in a maskless exposure apparatus.

DISCLOSURE OF THE INVENTION

Therefore, an aspect of the detailed description is to provide a maskless exposure apparatus and a maskless exposure method, which can improve resolution of an exposure pattern using a spatial filter for changing the phase of light containing a predetermined pattern, i.e., a spatial filter having a phase shifter pattern formed therein.

Another aspect of the detailed description is to provide a maskless exposure apparatus and a maskless exposure method, in which a phase shifter pattern is formed using phase shift masks having various structures, so that it is possible to improve exposure efficiency by easily changing the phase of light containing a predetermined pattern.

Still another aspect of the detailed description is to provide a maskless exposure apparatus and a maskless exposure method, which can reduce the number of times of repetitive scanning for exposure and quickly and precisely perform an exposure process, using a spatial filter having a phase shifter pattern formed therein.

To achieve these and other advantages and in accordance with the purpose of the present invention, as embodied and broadly described herein, there is provided To achieve these and other advantages and in accordance with the purpose of this specification, as embodied and broadly described herein, a maskless exposure apparatus includes a lighting unit configured to irradiate predetermined light; a spatial light modulator (SLM) configured to receive the light irradiated from the lighting unit and emit the received light as light containing a predetermined pattern; a beam expander configured to expand the light emitted from the SLM; a micro lens array (MLA) configured to split the light expanded by the beam expander into a plurality of lights and condense the split lights; and a projection lens configured to control resolution of the lights condensed by the MLA and project the lights onto an object, wherein a spatial filter having a phase shifter pattern is provided between the MLA and the projection lens.

In one exemplary embodiment, the spatial filter may allow the lights split and condensed by the MLA to pass therethrough and have a plurality of holes formed to be spaced apart from one another, and the holes may have an array form having a size of N×N.

In one exemplary embodiment, the phase shifter pattern may be a line-type phase shifter pattern formed on holes having a size of 1×N or N×1 among the plurality of holes included in the spatial filter.

In one exemplary embodiment, the phase shifter pattern may be an array-type phase shifter pattern formed on holes having a size of N×N among the plurality of holes included in the spatial filter.

In one exemplary embodiment, the phase shifter pattern may be formed on the spatial filter using a phase shift mask.

In one exemplary embodiment, the phase shift mask may be one selected from an attenuated phase shift mask, an alternating phase shift mask, an out-rigger phase shift mask, a chromeless phase shift mask and a rim-type phase shift mask.

In one exemplary embodiment, the maskless exposure apparatus may further include a pattern generator configured to receive predetermined CAD data containing position alignment information of a scan stage so as to generate a predetermined optical pattern and transmit the generated optical pattern to the SLM.

In one exemplary embodiment, the maskless exposure apparatus may further include a total internal reflection (TIR) prism configured to adjust the angle of the light irradiated from the lighting unit and transmit the light to the SLM, and adjust the angle of the light containing the predetermined pattern, incident from the SLM, and emit the light to the beam expander.

In one exemplary embodiment, the lighting unit may include a light source configured to irradiate light; a mirror configured to reflect the light irradiated from the light source; and a fly eye lens and a condenser lens, configured to condense the light reflected from the mirror onto the SLM.

To achieve these and other advantages and in accordance with the purpose of this specification, as embodied and broadly described herein, there is provided a maskless exposure method includes irradiating, by a lighting unit, light to an SLM; reflecting, by the SLM, the light irradiated from the lighting unit as light containing a predetermined pattern; expanding, by a beam expander, the light reflected from the SLM and transmitting the expanded light to an MLA; splitting, by the MLA, the light transmitted from the beam expander into a plurality of lights and condensing the split lights; passing the lights split and condensed by the MLA through a spatial filter having a phase shifter pattern; and controlling, by a projection lens, resolution of the lights passing through the spatial filter and projecting the lights onto an object.

In one exemplary embodiment, the maskless exposure method may further include inputting, by a pattern generator, predetermined CAD data containing position alignment information of a scan stage to the SLM.

In one exemplary embodiment, the spatial filter may allow the lights split and condensed by the MLA to pass therethrough and have a plurality of holes formed to be spaced apart from one another, and the holes may have an array form having a size of N×N.

In one exemplary embodiment, the phase shifter pattern may be a line-type phase shifter pattern formed on holes having a size of 1×N or N×1 among the plurality of holes included in the spatial filter.

In one exemplary embodiment, the phase shifter pattern may be an array-type phase shifter pattern formed on holes having a size of N×N among the plurality of holes included in the spatial filter.

In one exemplary embodiment, the phase shifter pattern may be formed on the spatial filter using a phase shift mask.

In one exemplary embodiment, the phase shift mask may be one selected from an attenuated phase shift mask, an alternating phase shift mask, an out-rigger phase shift mask, a chromeless phase shift mask and a rim-type phase shift mask.

To achieve these and other advantages and in accordance with the purpose of this specification, as embodied and broadly described herein, there is also provided a display panel or printed circuit board (PCB) manufactured using the maskless exposure method.

The present invention may have the following advantages.

The maskless exposure apparatus has a spatial filter for changing the phase of light containing a predetermined pattern, i.e., a spatial filter having a phase shifter pattern formed therein, so that it is possible to prevent a cross-talk, etc., thereby improving the resolution of an exposure pattern.

Further, the spatial filter having the phase shifter pattern formed therein is built in the maskless exposure apparatus, so that it is possible to easily change the phase of light, thereby improving exposure efficiency.

Further, although the number of times of repetitive scanning is reduced in the maskless exposure apparatus, an exposure process can be quickly and precisely performed.

MODES FOR CARRYING OUT THE PREFERRED EMBODIMENTS

Reference will now be made in detail to the preferred embodiments of the present invention, examples of which are illustrated in the accompanying drawings. It will also be apparent to those skilled in the art that various modifications and variations can be made in the present invention without departing from the spirit or scope of the invention. Thus, it is intended that the present invention cover modifications and variations of this invention provided they come within the scope of the appended claims and their equivalents.

The present invention proposes a digital exposure apparatus to which a spatial filter is added in order to remove high-frequency noise of light patterns, which may be generated between a micro lens array (MLA) and a projection lens.

That is, in the present invention, a spatial filter formed by arranging hole with a predetermined size at a certain interval is provided in order to remove high-frequency noise generated by the MLA and non-uniformity of the MLA, which occurs in a process.

However, the interval between dots of light split and condensed by the MLA may not exactly correspond to that between holes of the spatial filter, which may cause problems in that the resolution of exposure patterns is reduced and the entire efficiency of an optical system is degraded.

In order to solve such problems, in the present invention, a phase shifter pattern is formed on the spatial filter using various kinds of phase shift masks, so that it is possible to overcome the existing problems, i.e., the degradation of the efficiency of the optical system and the reduction of the resolution of the exposure patterns, which occurs due to light interference caused by a cross-talk.

Figure 1A:
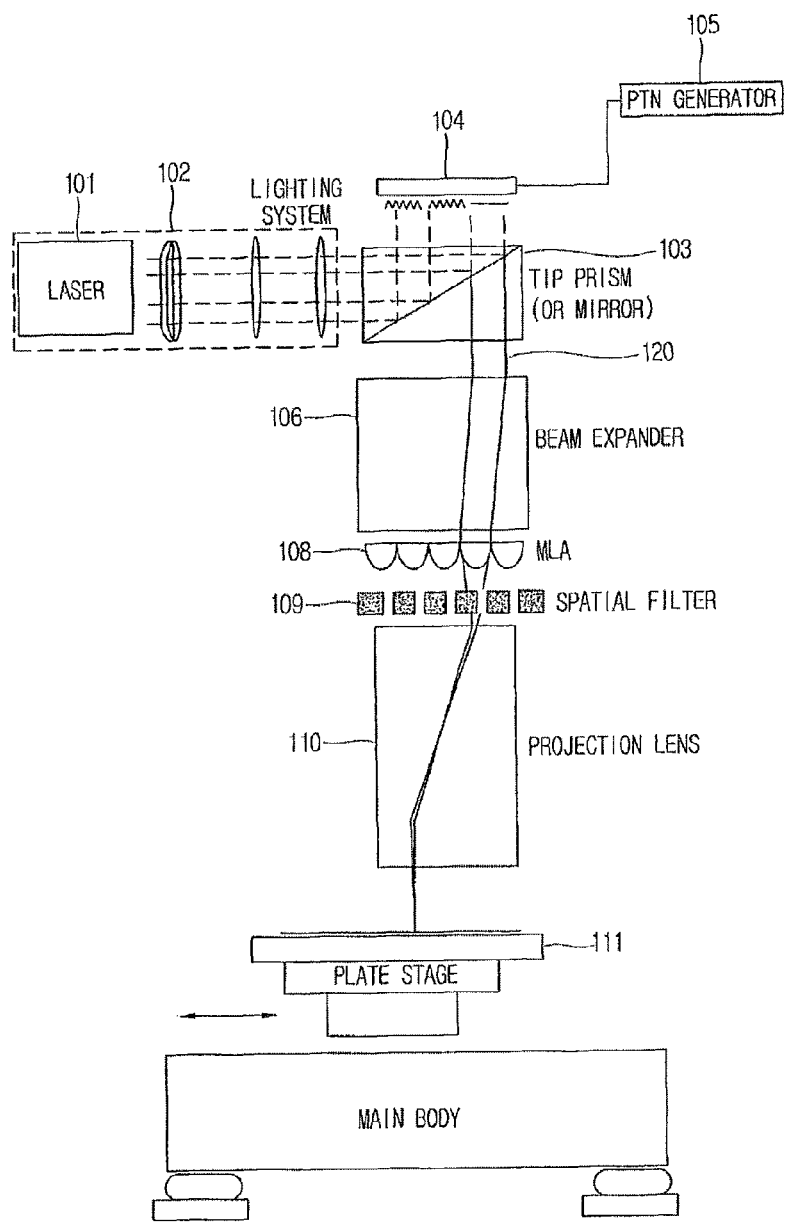
FIGS. 1A and 1B are exemplary views illustrating a maskless exposure apparatus according to an exemplary embodiment of the present invention.
Figure 1B:
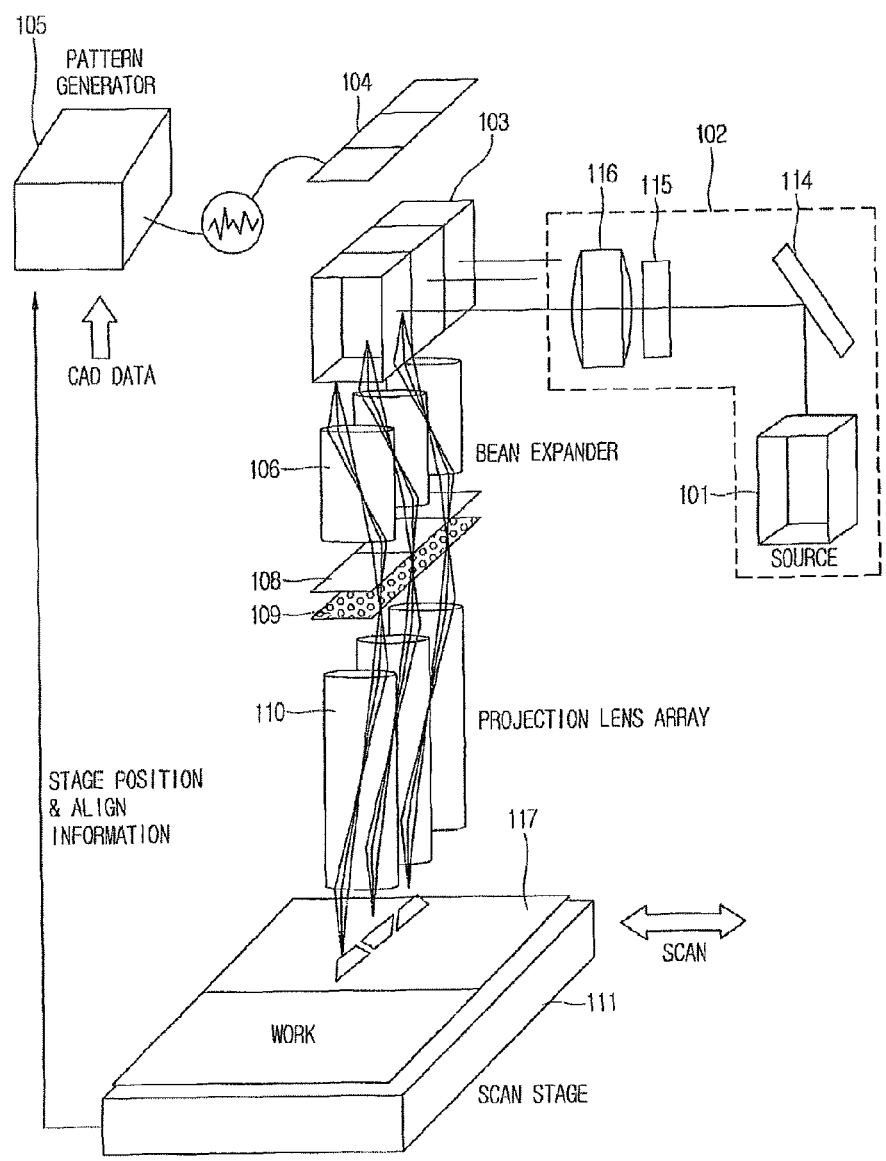

FIGS. 1A and 1B are exemplary views illustrating a maskless exposure apparatus according to an exemplary embodiment of the present invention.

The maskless exposure apparatus according to the exemplary embodiment of the present invention includes a lighting unit 102 that irradiates a predetermined light; a spatial light modulator (SLM) 10 that receives the light irradiated from the lighting unit 102 and emits the received light as light having a predetermined pattern; a beam expander 106 that expands the light emitted from the SLM 104; a micro lens array (MLA) 108 that splits the light expanded in the beam expander 106 into a plurality of lights and condenses the plurality of lights; and a projection lens 110 that projects the lights condensed in the MLA 108 onto an object by adjusting resolution of the lights. A spatial filter 109 having a phase shifter pattern is interposed between the MLA and the projection lens.

In the maskless exposure apparatus, the lighting unit 102 may include a light source 101 that irradiates light, at least one mirror 114 that reflects the light irradiated from the light source 101, and a fly eye lens 115 and a condenser lens 116, which condenses the light reflected from the mirror 114 onto the SLM 104.

The light source 101 preferably irradiates parallel light such as laser light or ultraviolet (UV) light, but the present invention is not limited thereto. The light source 101 may irradiate parallel light using a super high-pressure mercury lamp, excimer laser, diode pumped solid state (DPSS) laser, laser diode, etc.

The intensity of the laser light or UV light is basically very low, and therefore, the laser light or UV light is preferably converted into light having an intensity, which can be projected onto the SLM. Thus, in the maskless exposure apparatus, the intensity of light can be controlled using the at least one mirror 114, the fly eye lens 115 and the condenser 116, thereby projecting the light onto the SLM 104.

The maskless exposure apparatus includes the SLM 104 that receives the light irradiated from the lighting unit 102 and irradiates light having a predetermined pattern.

The SLM 104 may be formed using a transmissive SLM or a reflective SLM. The transmissive SLM may be formed using a liquid crystal display (LCD) or transmissive liquid crystal on silicon (LCoS) that receives an external signal so as to selectively 'transmit' light. The reflective SLM may be formed using a digital micromirror device (DMD) having a plurality of micro mirrors arranged therein or reflective LCoS that receives an external signal so as to selectively 'reflect' light.

That is, in the maskless exposure apparatus, the SLM 104 may be divided into a transmissive SLM and a device that controls light using a reflective SLM according to the method in which the SLM 104 that is a light amount control device controls light. The transmissive SLM or reflective SLM may be an element added to improve illumination intensity uniformity by controlling an individual does (light amount) and a steering angle of beam.

In a case where the SLM 104 is formed using the transmissive SLM, i.e., the LCD or transmissive LCoS, the operating frequency of the LCD or transmissive LCoS is relatively lower than that of the DMD, and hence it is difficult to control the steering angle of beam. However, if a specific pattern is generated and input for a certain period, it is possible to control the illumination intensity uniformity or does uniformity of beam incident from the light source.

In a case where the SLM 104 is formed using the reflective SLM, i.e., the DMD or reflective LCoS, it is possible to generate a desired exposure pattern by easily controlling the slope angle and focusing of mirrors included in the DMD or reflective LCoS.

The DMD is a device which can control a light path for each pixel, and each pixel of the device acts as one mirror. Therefore, the mirror maintains an angle of zero degree and then inclined at a certain angle when light is input to the mirror. Accordingly, light reaches or does not reach an object by controlling the light path, so that a pattern is exposed.

That is, in the DMD, light should be able to be emitted to a desired position on a stage plate by changing the angle of each unit mirror to be suitable for the shape of the exposure pattern. The maskless exposure apparatus may further include Fraunhofer-Institute Photonic Microsystems (IPMS) capable of controlling the slope angle and focus of a plurality of micro mirrors, so that the angle and focus of the unit mirror of the DMD can be easily controlled.

A pattern generator 105 may be used so that the SLM 104 emits the light irradiated from the light source 101 as the light having the predetermined pattern.

The pattern generator 105 receives position alignment information from a scan stage 111 that moves an exposure position in a state in which an object to be exposed is put on the scan stage 111, and receives CAD data for a specific pattern to be exposed. Then, the pattern generator 105 inputs the position alignment information and the CAD data to the SLM 104. The SLM 104 that has received the position alignment information and the CAD data can add a predetermined pattern to the light irradiated from the light source 101 so as to reflect the light having the predetermined pattern added thereto.

The maskless exposure apparatus may further include a total internal reflection (TIR) prism 103 provided between the lighting unit 102 and the SLM 104. The TIR prism 103 adjusts the angle of the light irradiated from the lighting unit 102 and emits the light to SLM 104. The TIR prism 103 adjusts the angle of the light having the predetermined pattern, reflected from the SLM 104, and emits the light to the beam expander 106.

The light reflected from the SLM 104 or the light emitted from the TIR prism 103 is provided to the beam expander 106. The beam expander 106 expands the received light and provides the expanded light to the MLA 108.

The MLA 108 splits the light expanded in the beam expander 106 into a plurality of lights and condenses the split lights. That is, the MLA 108 condenses the light received from the beam expander 106 as a small spot or dot onto the scan stage 111. Each lens element of the MLA 108 may be a circular or quadrangular spherical or a spherical lens. The lens elements are arranged in an array form for integrating information on the area of each pixel as a spot or dot having a certain size so as to implement high resolution in exposure.

The lights condensed by the MLA 108 are provided to the projection lens 110. The projection lens 110 controls the resolution of the received lights and projects the lights to an object 117. If the MLA 108 is adjacent to the top surface of the scan stage 111, the transmittance of light may be decreased by fume, etc., emitted from a pattern material. Thus, the projection lens can be provided to prevent the transmittance of light from being decreased and to project the light condensed by the MLA 108 onto the scan stage 111 as it is.

The maskless exposure apparatus is provided with the spatial filter 109 having a phase shifter pattern so as to prevent degradation of the resolution of the exposure pattern, caused as the dot interval and hole interval between the lights split and condensed by the MLA 108 do not correspond to each other, and low efficiency of the entire optical system. The spatial filter 109 will be described later.

Figure 2A:
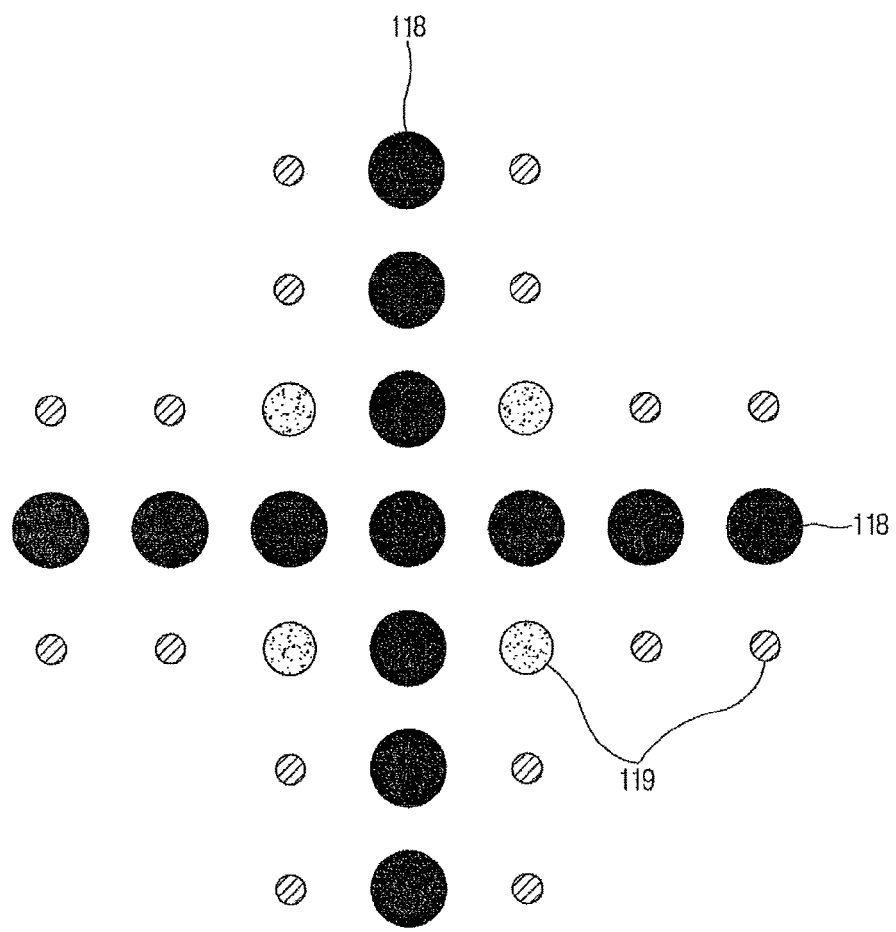
FIG. 2A is an exemplary view illustrating a cross-talk of an exposure pattern according to a related art.

FIG. 2A is an exemplary view illustrating a cross-talk of an exposure pattern according to a related art.

The cross-talk results from movement of electrons generated in a predetermined substrate due to the photo-electric effect caused by optical energy and light incident at an oblique angle. Particularly, in the maskless exposure apparatus, the cross-talk frequently occurs due to the disagreement of the degree of alignment between the MLA and the spatial filter or between the MLA and the projection lens.

Referring to FIG. 2A, there are shown high-resolution spots 118 and low-resolution spots 119. In this case, it can be seen that as the interval between pixels is narrowed, there occurs a cross-talk in which photoelectrons generated in one unit pixel easily move to another unit pixel adjacent to the one unit pixel.

The high-resolution spot 118 represents a dose that approaches an exposure pattern input by a user and must be projected onto an actual photoresist (PR) surface. The low-resolution spot 119 is generated due to disagreement between optical systems such as disagreement between the SML and the MLA. The low-resolution spot 119 cannot be used as an actual exposure pattern, which is problematic.

Therefore, the maskless exposure apparatus includes a spatial filter provided with a phase shifter structure using a phase shift mask. The spatial filter will be described later.

Figure 2B:
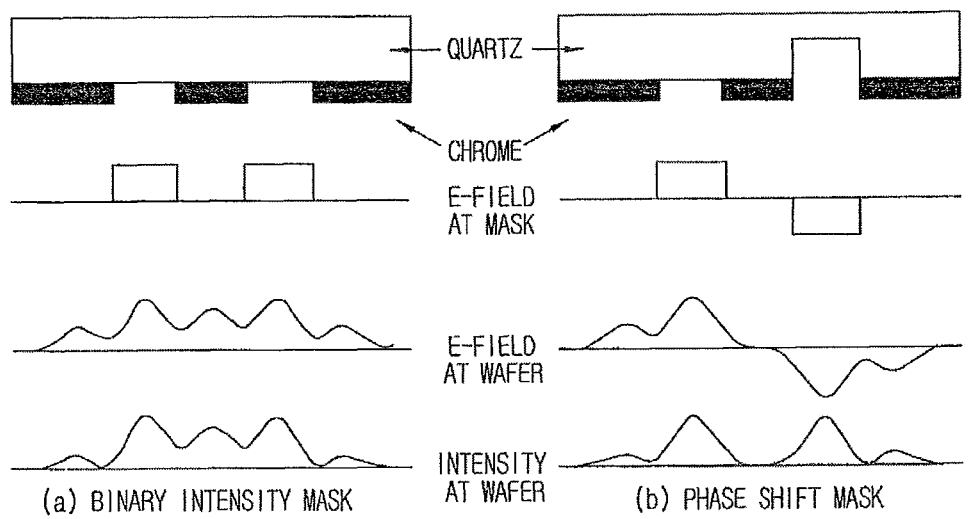
FIG. 2B is a view comparing a binary intensity mask and a phase shift mask.

FIG. 2B is a view comparing a binary intensity mask and a phase shift mask.

The present invention is provided to improve the resolution of the digital exposure apparatus by forming a phase shifter pattern on the spatial filter using a phase shift mask. To this end, it is possible to decrease the spatial frequency of an optical pattern, i.e., periodic patterns by appropriately reversing the phase of light using the phase shift mask and to maximize the resolution of the digital exposure apparatus using the interference effect that increases isolation patterns, i.e., contrast at edges of the patterns. Further, it is possible to improve the exposure latitude of a photosensitive material and to increase the depth of focus (DOF).

Generally, a photomask functions to form a desired pattern on a wafer by irradiating light on a mask pattern formed on a transparent substrate and transferring selectively transmitted light onto the wafer. Conventionally, a binary mask was used as the photomask. Here, the binary mask is generally divided into a light transmission region in which light is transmitted to a substrate in which a light shielding pattern including chrome (Cr) is formed and a light shielding region in which light is shielded.

However, as the integration of devices increases, patterns are micro-sized, and therefore, it is difficult to exactly implement a desired pattern due to diffraction or interference of light transmitted to the binary mask.

In order to overcome such a difficulty in implementing an exact pattern, studies on a phase shift mask using a phase shifting material with transmittance of a few % have been actively conducted.

FIG. 2B schematically compares electric fields and light intensities obtained by using the binary mask and the phase shift mask.

FIGS. 2C to 2H are exemplary views illustrating electric fields/intensities based on kinds of phase shift masks according to an exemplary embodiment of the present invention.

In the exemplary embodiment of the present invention, a phase shift pattern can be formed on the spatial filter, using any one selected from an attenuated phase shift mask, an alternating phase shift mask, an out-rigger phase shift mask, a chromeless phase shift mask and a rim-type phase shift mask. That is, the phase shifter can be easily implemented using a method of attaching a phase shift mask having a predetermined pattern formed therein on the spatial filter, etc.

Figure 2C:
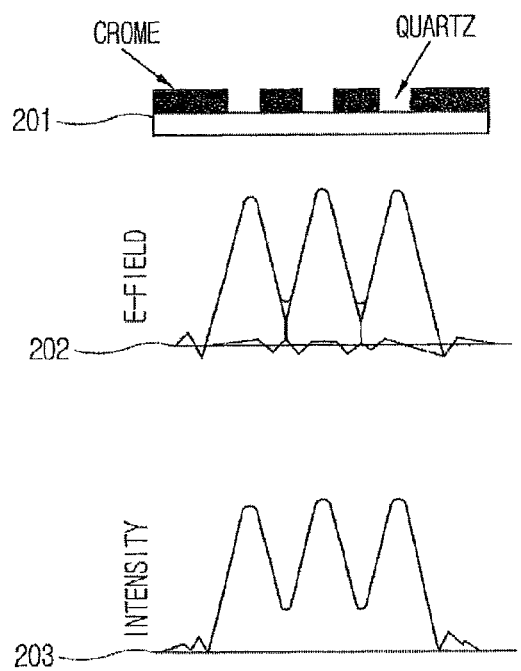
FIGS. 2C to 2H are exemplary views illustrating electric fields/intensities based on kinds of phase shift masks according to an exemplary embodiment of the present invention.

FIG. 2C schematically illustrates the structure 201, electric field 202 and light intensity 203 of a general binary mask.

The binary mask has a structure in which a pattern is formed on quartz by chrome (Cr). In the structure, a portion having a chrome layer allows light to be transmitted, but a portion having no chrome layer allows light not to be transmitted, to be exposed. In a case where the pattern is very fine, lights respectively incident into transmitting portions at both sides of the chrome pattern interfere with each other, and therefore, the chrome does not completely act as a light shielding portion. Further, constructive interference of the exposed light occurs, and therefore, even a portion to be light-shielded is exposed.

That is, when the electric field passing through the mask approaches an object to be exposed, a desired pattern may not be formed by the diffraction and constructive interference. Therefore, a photosensitizing agent on the wafer is excessively exposed to light so that a portion of the photosensitizing agent is removed in development. As a result, if the chrome is not sufficiently wide, the chrome cannot act as the light shielding portion, which results in limitation of resolution. Thus, as the design of a pattern is fine, the pattern has a limitation as the binary mask, and hence the phase shift mask is used as the binary mask.

Hereinafter, a case in which a pattern is formed using various kinds of phase shift masks will be compared with a case in which a pattern is formed using a binary mask.

Figure 2D:
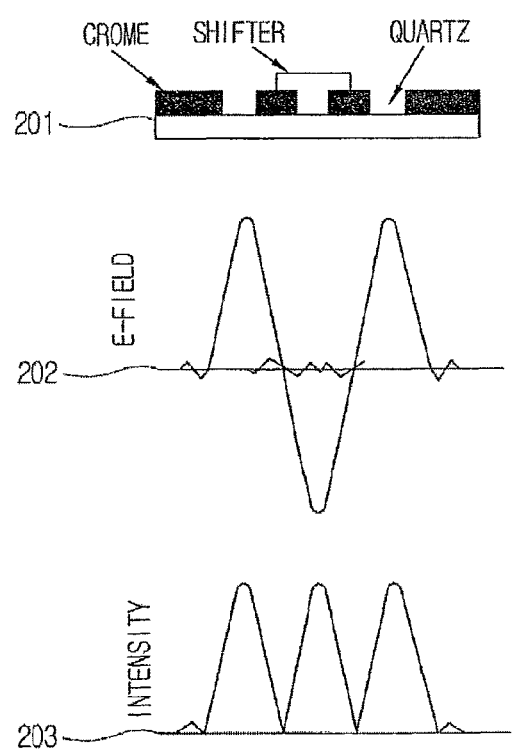

FIG. 2D illustrates the structure 201, electric field 202 and light intensity 203 of an alternating phase shift mask.

The alternating phase shift mask has a structure in which lights respectively transmitted to a portion obtained by selectively etching a quartz substrate and a non-etched portion have a phase difference of 180 degrees. Since the phase difference between the etched portion and the non-etched portion becomes 180 degrees by etching the quartz substrate, the transmittances of the etched portion and the non-etched portion are hardly different from each other. Therefore, complete destructive interference occurs at the boundary between adjacent patterns.

That is, in the alternating phase shift mask, a phase shift layer in which the phase difference between portions at both sides of a pattern becomes 180 degrees is formed so that light passing through the mask exists at a portion at which the minimum intensity of light is zero on the wafer, thereby obtaining a desired pattern. Thus, no matter how the size of the chrome (Cr) is small, the boundary portion at which the phase is reversed can always act as a light shielding portion, which results in improvement of the resolution of the phase shift mask.

Figure 2E:
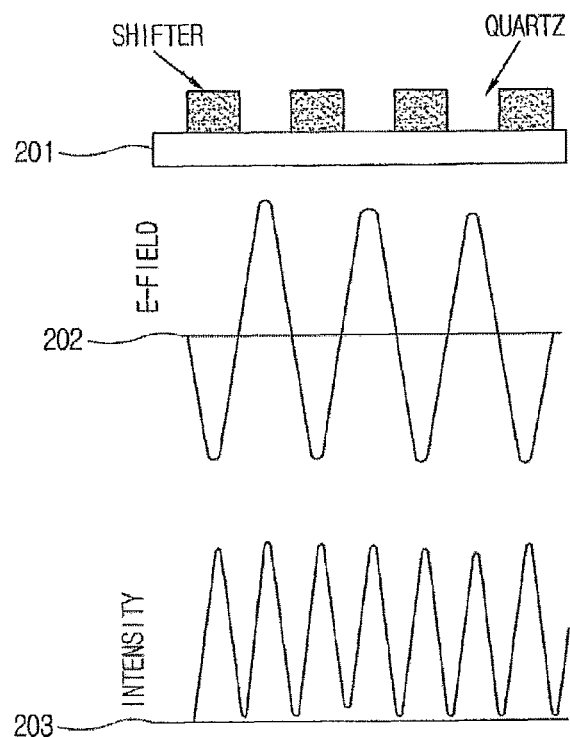

FIG. 2E illustrates the structure 201, electric field 202 and light intensity 203 of a chromeless phase shift mask.

The chromeless phase shift mask has a structure in which light intensity is decreased by changing only the phase of light irradiated onto a quartz substrate not by using a chrome (Cr) layer but by using a groove formed in the quartz substrate, so that a line pattern with a fine width is formed. That is, in the chromeless phase shift mask, a pattern is transferred onto a wafer not by using a material for shielding light, such as a light shielding layer pattern, but by using a step difference with a trench formed in the transparent substrate, and the phase difference of light is changed depending on a depth of the trench formed in the substrate.

Therefore, the transmittance of light passing through a portion at which a phase shifting material layer is not formed approximates to 100% and has a phase difference of zero degree. The transmittance of light passing through a portion at which the phase shifting material layer is formed becomes 100% but has a phase difference of 180 degrees as compared with the light passing through the portion at which the phase shifting material layer is not formed.

Figure 2F:
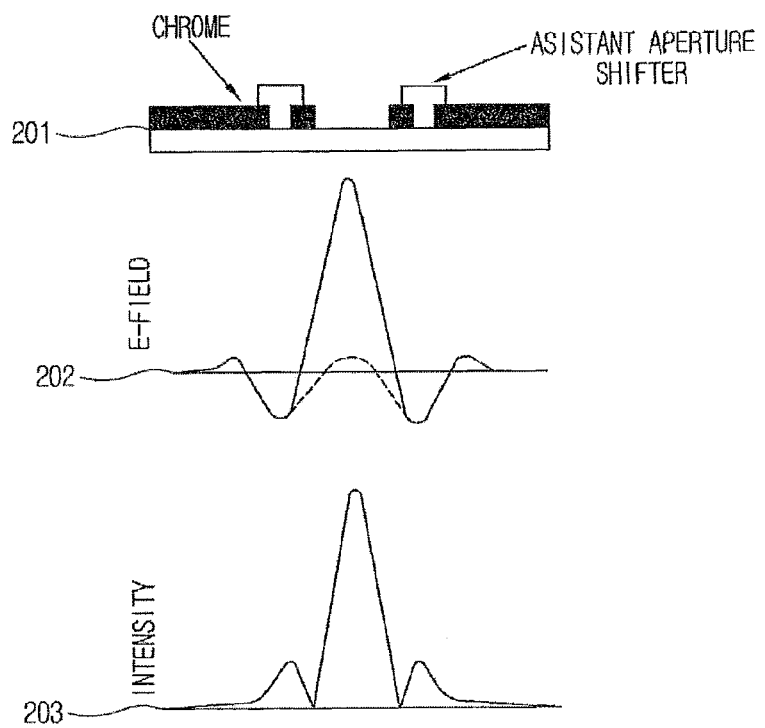

FIG. 2F illustrates the structure 201, electric field 202 and light intensity 203 of an out-rigger phase shift mask.

Referring to FIG. 2F, a chrome layer that is a light shielding layer is formed on a quartz substrate, a plurality of openings are formed in a predetermined region of the chrome layer, and an assistant phase shifting material layer is formed on the opening. Generally, it is designed that light transmitted through the chrome layer and light transmitted through the assistant phase shifting material layer have a phase difference of 180 degrees. That is, since all neighboring patterns are formed to have the phase difference of 180 degrees, phases between the neighboring patterns are opposite to each other, and thus it is possible to prevent a problem in that a pattern is formed at an unwanted portion by the destructive interference.

Figure 2G:
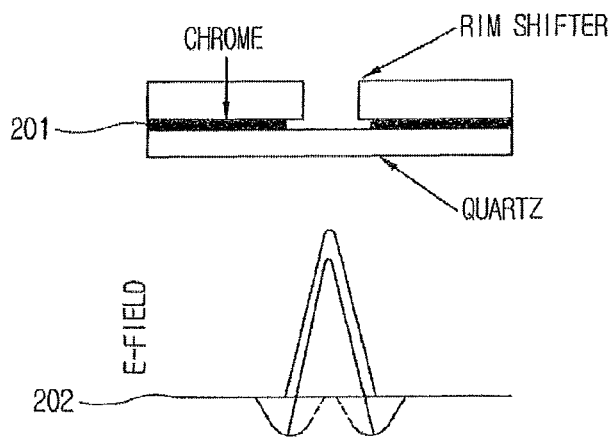

FIG. 2G illustrates the structure 201, electric field 202 and light intensity 203 of a rim-type phase shift mask.

For incident light, light shielding patterns formed of chrome (Cr) are formed on a quartz substrate, and a certain region between the light shielding patterns is etched to have a predetermined depth. That is, a protruding portion of the quartz substrate the light shielding patterns formed of the chrome form a rim shape. In this case, a phase shifting material may be further formed on the light shielding pattern.

The rim-type phase shift mask can obtain high resolution and focus depth using the phase difference between incident lights respectively passing through the protruding and recessed portions of the quartz substrate.

Figure 2H:
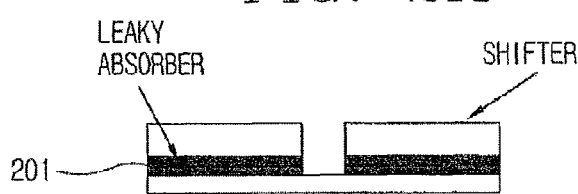
Figure 2H:
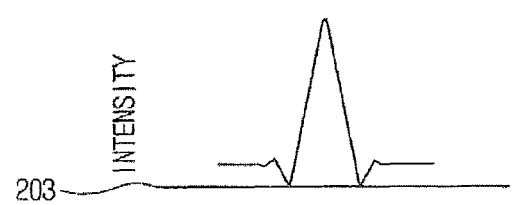

FIG. 2H illustrates the structure 201, electric field 202 and light intensity 203 of an attenuated phase shift mask.

The attenuated phase shift mask frequently uses a phase shifting material such as Mo/Si/O/N. If the phase difference between light passing through the phase shifting material and light passing through quartz becomes 180 degrees when the lights arrive on the an object to be exposed, destructive interference occurs at the boundary portion between patterns, and thus it is possible to solve a problem of pattern formation, which occurs in the binary mask. Further, as a portion of the mask pattern is changed into a half-tone from an opaque tone, so that it is possible to improve the performance of a resist pattern and to improve the resolution and focus depth of the digital exposure apparatus.

That is, as described in FIGS. 2D to 2H, in the maskless exposure apparatus, phase shifter patterns are formed by attaching various phase shift masks to the spatial filter, and the phase of light transmitted using the phase shifter patterns is easily changed, so that it is possible to maximize the resolution and focus depth of the digital exposure apparatus.

Figure 3A:
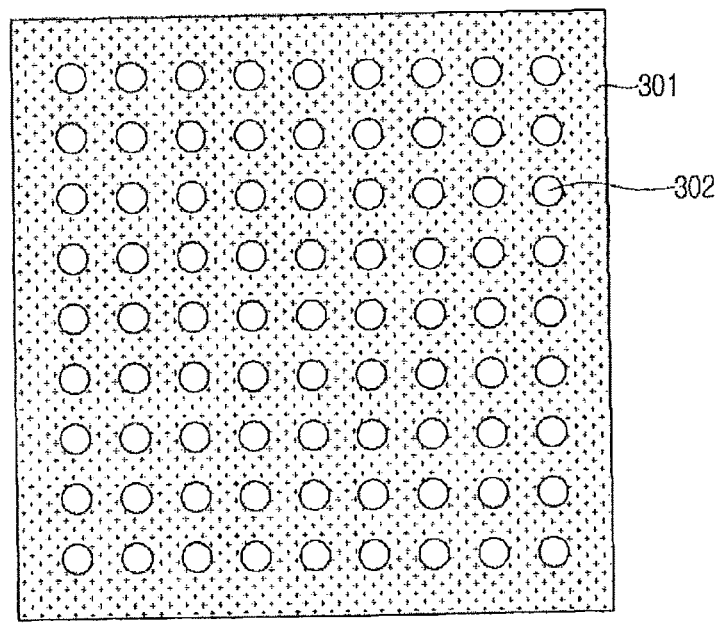
FIGS. 3A to 3C are exemplary views illustrating spatial filters having phase shifter patterns according to an exemplary embodiment of the present invention.
Figure 3B:
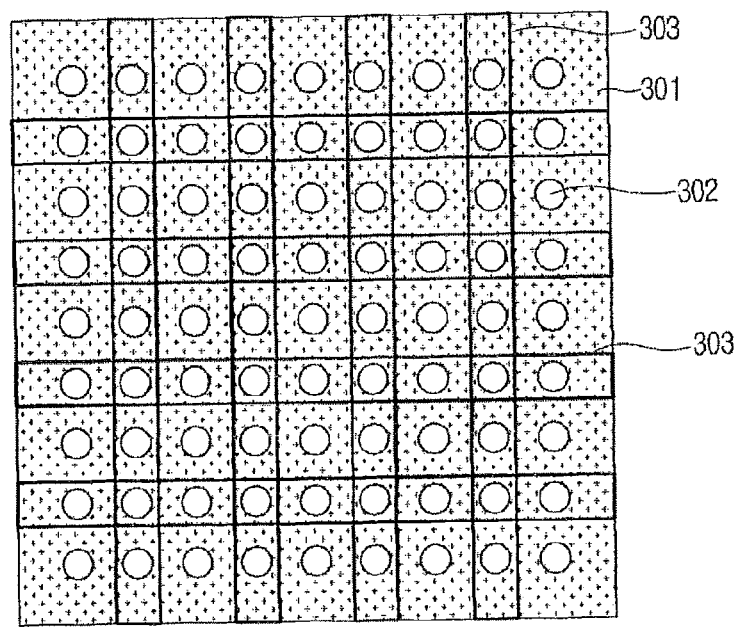
Figure 3C:
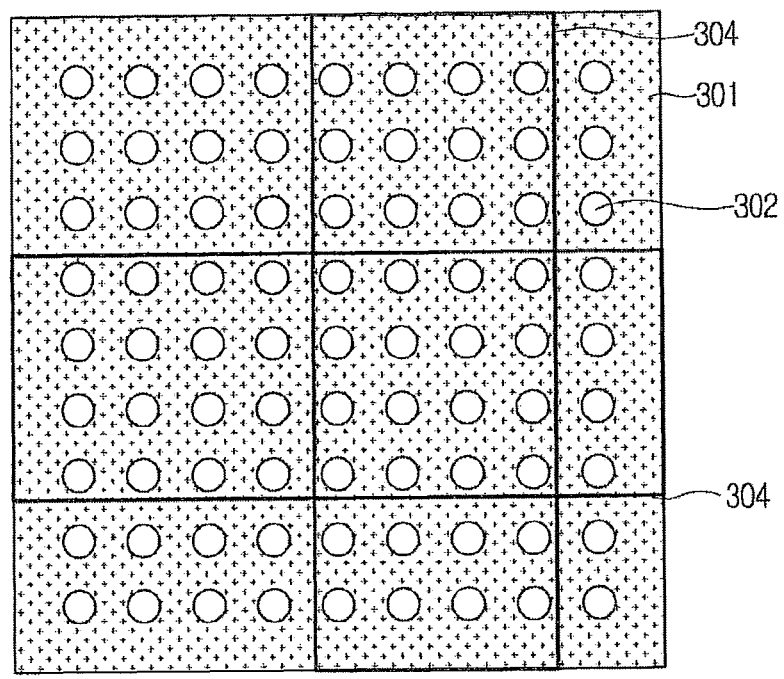

FIGS. 3A to 3C are exemplary views illustrating spatial filters having phase shifter patterns according to an exemplary embodiment of the present invention.

In the exemplary embodiment of the present invention, a phase shifted spatial filter is manufactured by patterning a phase shifter at a predetermined interval on a spatial filter 301 in a process of manufacturing the spatial filter 301, and is applied to a digital exposure apparatus. Accordingly, such an exposure method is applied to a method of manufacturing a display panel or printed circuit board (PCB)

Referring to FIG. 3A, the spatial filter 301 allows lights split and condensed by the MLA to pass therethrough, and has a plurality of holes 302 formed to be spaced apart from one another. The holes 302 preferably has an array form having a size of N×N.

A phase shifter pattern formed on the spatial filter 301 may be a line-type phase shifter pattern 303 formed on holes having a size of '1×N' or 'N×1' among the plurality of holes included in the spatial filter 301 (See FIG. 3B).

The phase shifter pattern is not limited thereto, but may be an array-type phase shifter pattern 304 formed on holes having a size of 'N×N' among the plurality of holes included in the spatial filter 301 (See FIG. 3C).

As such, the spatial filter 301 can be designed to have one-dimensional type (line) and two-dimensional type (array) phase shift patterns, and enables phases of lights split and condensed by the MLA to be simply and easily changed to be emitted. Thus, it is possible to prevent a defect such as a cross-talk or periodic spot of an exposure pattern and to improve the resolution of the exposure pattern.

Figure 4:
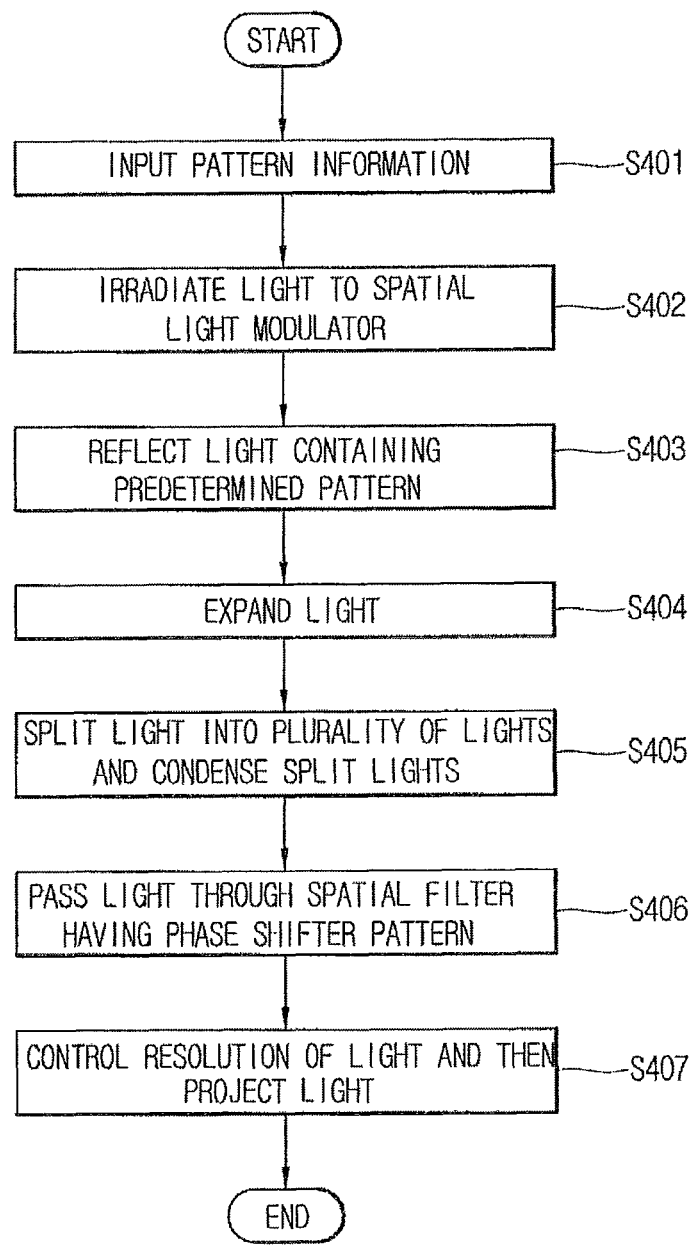
FIG. 4 is a flowchart illustrating a maskless exposure method according to an exemplary embodiment of the present invention.

FIG. 4 is a flowchart illustrating a maskless exposure method according to an exemplary embodiment of the present invention.

First, the pattern generator inputs CAD data containing position alignment information and predetermined pattern information of the scan stage to the SLM (S401).

If glass for exposure, etc is loaded into the maskless exposure apparatus, an initial alignment is finished with reference to the position of an initially defined mark, etc., and the scan stage moves to the start position of a previously input pattern. If the scan stage is placed at the start position, a synchronization signal is generated according to the movement position of the scan stage in the scan direction, using a position feedback sensor such as a laser sensor. A pattern is transferred to the SLM according to the synchronization signal, and a predetermined pattern is formed on glass or wafer by passing the transferred pattern through optical systems.

Subsequently, the lighting unit irradiates light onto the SLM (S402). The irradiating of the light onto the SLM in the lighting unit may include irradiating, by the light source, light; reflecting, the mirror, the light irradiated from the light source; and inputting the light reflected from the mirror to the SLM through a fly eye lens and a condenser lens. That is, the mirror, the fly eye lens and the condenser lens function to convert light having low intensity into light having intensity, which can be projected onto the SLM.

Subsequently, the SLM reflects the light irradiated from the lighting unit as light containing a predetermined pattern (S403). In this case, the SLM can generate and reflect the light containing the predetermined pattern using the CAD data containing the position alignment information, which is input from the pattern generator.

In the exemplary embodiment of the present invention, the TIR prism may be further provided between the lighting unit and the SLM. In a case where the TIR prism may be further provided between the lighting unit and the SLM, the irradiating of the light onto the SLM and the reflecting of the light may include irradiating, by the lighting unit, light onto the TIR prism; adjusting, by the TIR prism, the angle of the light irradiated from the lighting unit and emitting the light to the SLM; reflecting, by the SLM, the light emitted from the TIR prism as the light containing the predetermined pattern from the TIR prism; and adjusting, by the TIR prism, the angle of the light containing the predetermined pattern and emitting the light to the beam expander.

After these processes are finished, the beam expander expands the light reflected from the SLM and emits the expanded light to the MLA (S404). The process is a process for improving the quality of parallel light. In the process, it is possible to easily split the expanded light into a plurality of lights and then condense the split lights.

Subsequently, the MLA splits the light expanded by the beam expander into a plurality of lights and then condenses the split lights (S405). If the MLA condenses the split lights, a spot or dot of the light can be clearly shown, and thus an exposure pattern can be formed.

The lights split and condensed by the MLA through the processes described above pass through the spatial filter having a phase shifter pattern (S406).

The spatial filter allows the lights split and condensed by the MLA to pass therethrough, and has a plurality of holes formed to be spaced apart from one another. The holes may have an array form having a size of N×N.

The phase shifter pattern may be a line-type phase shifter pattern formed on holes having a size of '1×N' or 'N×1' or an array-type phase shifter pattern formed on holes having a size of 'N×N'. Thus, the pattern can be formed using a phase shift mask.

The phase shift mask can form a phase shifter pattern on the spatial filter, using any one selected from an attenuated phase shift mask, an alternating phase shift mask, an out-rigger phase shift mask, a chromeless phase shift mask and a rim-type phase shift mask. That is, the phase shifter can be easily implemented using a method of attaching a phase shift mask having a predetermined pattern formed therein on the spatial filter, etc.

Subsequently, the projection lens controls the resolution of the lights condensed by the MLA and projects the lights to an object to be exposed (S407), thereby completing an exposure process.

The present invention includes a display panel or PCB manufactured using the maskless exposure method. According to the maskless exposure method described above, cost spent in the exposure process can be remarkably reduced, and manufacturing time can be remarkably decreased. Further, a high-quality display panel or PCB can be obtained by performing a more precise exposure process.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

The invention claimed is:

1. A maskless exposure apparatus, comprising:
a lighting unit configured to irradiate predetermined light;
a spatial light modulator (SLM) configured to receive the light irradiated from the lighting unit and emit the received light as light containing a predetermined pattern;
a beam expander configured to expand the light emitted from the SLM;
a micro lens array (MLA) configured to split the light expanded by the beam expander into a plurality of lights and condense the split lights; and
a projection lens configured to control resolution of the lights condensed by the MLA and project the lights onto an object,
wherein a spatial filter having a phase shifter pattern is provided between the MLA and the projection lens.

2. The maskless exposure apparatus of claim 1, wherein the spatial filter allows the lights split and condensed by the MLA to pass therethrough and has a plurality of holes formed to be spaced apart from one another, and the holes have an array form having a size of N×N.

3. The maskless exposure apparatus of claim 1, wherein the phase shifter pattern is a line-type phase shifter pattern formed on holes having a size of 1×N or N×1 among the plurality of holes included in the spatial filter.

4. The maskless exposure apparatus of claim 1, wherein the phase shifter pattern is an array-type phase shifter pattern formed on holes having a size of N×N among the plurality of holes included in the spatial filter.

5. The maskless exposure apparatus of claim 1, wherein the phase shifter pattern is formed on the spatial filter using a phase shift mask.

6. The maskless exposure apparatus of claim 5, wherein the phase shift mask is one selected from an attenuated phase shift mask, an alternating phase shift mask, an out-rigger phase shift mask, a chromeless phase shift mask and a rim-type phase shift mask.

7. The maskless exposure apparatus of claim 1, further comprising a pattern generator configured to receive predetermined CAD data containing position alignment information of a scan stage so as to generate a predetermined optical pattern and transmit the generated optical pattern to the SLM.

8. The maskless exposure apparatus of claim 1, further comprising a total internal reflection (TIR) prism configured to adjust the angle of the light irradiated from the lighting unit and transmit the light to the SLM, and adjust the angle of the light containing the predetermined pattern, incident from the SLM, and emit the light to the beam expander.

9. The maskless exposure apparatus of claim 1, wherein the lighting unit comprises:
a light source configured to irradiate light;
a mirror configured to reflect the light irradiated from the light source; and
a fly eye lens and a condenser lens, configured to condense the light reflected from the mirror onto the SLM.

10. A maskless exposure method, comprising:
irradiating, by a lighting unit, light to an SLM;
reflecting, by the SLM, the light irradiated from the lighting unit as light containing a predetermined pattern;
expanding, by a beam expander, the light reflected from the SLM and transmitting the expanded light to an MLA;
splitting, by the MLA, the light transmitted from the beam expander into a plurality of lights and condensing the split lights;
passing the lights split and condensed by the MLA through a spatial filter having a phase shifter pattern; and
controlling, by a projection lens, resolution of the lights passing through the spatial filter and projecting the lights onto an object.

11. The maskless exposure method of claim 10, further comprising inputting, by a pattern generator, predetermined CAD data containing position alignment information of a scan stage to the SLM.

12. The maskless exposure method of claim 10, wherein the spatial filter allows the lights split and condensed by the MLA to pass therethrough and has a plurality of holes formed to be spaced apart from one another, and the holes have an array form having a size of N×N.

13. The maskless exposure method of claim 10, wherein the phase shifter pattern is a line-type phase shifter pattern formed on holes having a size of 1×N or N×1 among the plurality of holes included in the spatial filter.

14. The maskless exposure method of claim 10, wherein the phase shifter pattern is an array-type phase shifter pattern formed on holes having a size of N×N among the plurality of holes included in the spatial filter.

15. The maskless exposure method of claim 10, wherein the phase shifter pattern is formed on the spatial filter using a phase shift mask.

16. The maskless exposure method of claim 15, wherein the phase shift mask is one selected from an attenuated phase shift mask, an alternating phase shift mask, an out-rigger phase shift mask, a chromeless phase shift mask and a rim-type phase shift mask.

17. A display panel fabricated by the maskless exposure method of claim 10.

18. A printed circuit board (PCB) fabricated by the maskless exposure method of claim 10.

* * * * *